United States Patent
Lesso et al.

(10) Patent No.: US 11,509,272 B2
(45) Date of Patent: Nov. 22, 2022

(54) TIME ENCODING MODULATOR CIRCUITRY

(71) Applicant: Cirrus Logic International Semiconductor Ltd., Edinburgh (GB)

(72) Inventors: John P. Lesso, Edinburgh (GB); Toru Ido, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 17/319,620

(22) Filed: May 13, 2021

(65) Prior Publication Data

US 2021/0367567 A1 Nov. 25, 2021

Related U.S. Application Data

(60) Provisional application No. 63/028,225, filed on May 21, 2020.

(30) Foreign Application Priority Data

Jun. 12, 2020 (GB) ..................... 2008947

(51) Int. Cl.
*H03F 3/217* (2006.01)
*H03F 1/32* (2006.01)
*H03F 3/181* (2006.01)

(52) U.S. Cl.
CPC ....... *H03F 3/2175* (2013.01); *H03F 2200/03* (2013.01); *H03F 2200/351* (2013.01)

(58) Field of Classification Search
CPC ............... H03F 3/2175; H03F 2200/03; H03F 2200/351; H03F 3/2171; H03F 3/217; H03F 1/32; H03K 7/08; H03M 1/504

(Continued)

(56) References Cited

U.S. PATENT DOCUMENTS

| | | | |
|---|---|---|---|
| 9,887,672 B1* | 2/2018 | Kuo | ..................... H03F 3/45475 |
| 2008/0191685 A1 | 8/2008 | Dhuyvetter et al. | |
| 2021/0104984 A1* | 4/2021 | Lesso | ......................... H03F 1/26 |

FOREIGN PATENT DOCUMENTS

| | | |
|---|---|---|
| EP | 1703635 A1 | 9/2006 |
| EP | 1965496 A2 | 9/2008 |
| JP | 2006060549 A | 3/2006 |

OTHER PUBLICATIONS

Combined Search and Examination Report under Sections 17 and 18(3), UKIPO, Application No. GB2008947.0, dated Dec. 7, 2020.

(Continued)

*Primary Examiner* — Hieu P Nguyen
(74) *Attorney, Agent, or Firm* — Jackson Walker L.L.P.

(57) ABSTRACT

This application describes time-encoding modulator circuitry (200), and in particular a PWM modulator suitable for use for a class-D amplifier. A forward signal path receives a digital input signal (Din) and outputs an output PWM signal (Sout) and includes a first PWM modulator (101). A feedback path provides feedback to an input of the first PWM modulator (101). The feedback path includes an ADC (203) which receive a first PWM signal (Sa) derived from the output PWM signal. The ADC (203) includes a second PWM modulator (401) which generates a second PWM signal (Sb) based on the first PWM signal. A controller (201) controls the second PWM modulator such that a PWM carrier of the second PWM signal is phase and frequency matched to a PWM carrier of the output PWM signal.

20 Claims, 3 Drawing Sheets

(58) Field of Classification Search
USPC .................................... 330/251, 10, 207 A
See application file for complete search history.

(56) References Cited

OTHER PUBLICATIONS

Prata et al., "Agile All-Digital DPD Feedback Loop", IEEE Transactions on Microwave Theory and Techniques, vol. 35, No. 7, pp. 2476-2484.

* cited by examiner

TIME ENCODING MODULATOR CIRCUITRY

FIELD OF DISCLOSURE

The field of representative embodiments of this disclosure relates to methods, apparatus and/or implementations concerning or relating to time-encoding modulator (TEM) circuitry, and in particular to PWM (pulse-width-modulation) modulators.

BACKGROUND

Time-encoding modulators (TEMs) for encoding an input signal as a time-encoded signal, for instance a PWM (pulse-width-modulated) signal, are known and have been proposed for use in a variety of applications. For instance, digital PWM modulators have been proposed for use in class D amplifiers or drivers.

FIG. 1 illustrates one example of a circuit 100, in this example a class D amplifier circuit, having a PWM modulator 101. The PWM modulator 101 is configured to generate a PWM signal based on a digital input signal Din and the PWM signal output from the PWM modulator 101 is used to drive an output stage 102. The output stage comprises a plurality of switches for selectively connecting an output node of the output stage 102 to one of a plurality of defined voltages, e.g. a positive supply voltage and ground, or positive and negative supply voltages. The output node thus varies between these voltage levels, with a duty cycle that is controlled by the PWM signal output, such that the average voltage of the output signal Sout depends on the value of the digital input signal Sin. The output signal Sout may be supplied to a load (not illustrated), for instance to drive an output transducer such as a loudspeaker. The output signal Sout may be filtered at least partly by the load and/or by an output filter (not illustrated) so that the load experiences an analogue driving signal. In this example, FIG. 1 illustrates a half-bridge output stage 102 for outputting the output signal Sout to the load, but it will be appreciated that a class D amplifier may be implemented with a full-bridge output stage.

Whilst such a class D circuit could be operated in an open-loop mode, analogue effects within the amplifier circuit can result in distortion. For instance, output stage transistor on-resistance, finite rise and fall times, propagation delays and power supply ripples may result in distortion in the output signal Sout. Typically, therefore, the class D circuit is operable in a closed-loop mode of operation that uses negative feedback to suppress such distortion. The class D amplifier circuit 100 thus also includes a feedback path with an analogue-to-digital converter (ADC) 103 for receiving, via an anti-alias filter 104, a feedback signal tapped from the output and converting it to digital. The digital feedback signal is subtracted from the input signal to generate an error signal which is input to a loop filter 105, such as an integrator for example. The output of the loop filter 105 is, in this example, combined with the digital input signal in the forward signal path.

A class D amplifier circuit 100 such as illustrated in FIG. 1 can be advantageously implemented for a number of applications.

SUMMARY

Embodiments of the present disclosure relate to improvements in time-encoding modulator circuits, for example for time-encoding modulator circuits suitable for use for class-D amplifiers that may have advantages in terms of size and/or gain.

According to an aspect of the disclosure there is provided modulator circuitry comprising:
- a forward signal path for receiving a digital input signal and outputting an output PWM signal, the forward signal path comprising a first PWM modulator;
- a feedback path for providing feedback to an input of the first PWM modulator, the feedback path comprising an ADC configured to receive a first PWM signal derived from the output PWM signal;
- wherein the ADC comprises a second PWM modulator configured to generate a second PWM signal based on the first PWM signal; and
- a controller for controlling the second PWM modulator such that a PWM carrier of the second PWM signal is phase and frequency matched to a PWM carrier of the output PWM signal.

The ADC may be configured to combine, at an input to the ADC, the first PWM signal with the second PWM signal generated by the second PWM modulator.

In some examples the controller may be configured to monitor the first PWM signal and to adaptively control the ADC based on the monitored first PWM signal to match the PWM carrier of the second PWM signal to that of the first PWM signal.

In some examples, the controller may be configured to monitor the first PWM signal and the second PWM signal to determine any phase differences between defined signal transitions in the first and second PWM signals and to control the ADC to reduce said phase differences. The controller may form a phase-locked-loop with at least part of the second PWM modulator. The controller may comprise a phase and frequency detector for determining the phase differences. In some examples, the controller may be configured to adaptively control a frequency of a reference waveform, wherein the reference waveform defines a PWM cycle period of the second PWM modulator. The reference waveform may be a triangle waveform.

In some examples, the controller may comprise a controlled oscillator for generating an oscillation signal at a controlled frequency, wherein the second PWM modulator comprises a triangle waveform generator configured to generate a triangle waveform that ramps up and down based on the oscillation signal. In some examples the controller may comprise a square wave generator for generating a square wave which is supplied to an integrator to generate the triangle waveform. The square wave generator may be configured such that square wave has a controllably variable cycle period and with an amplitude that varies with any change in cycle period so that a product of amplitude and period is substantially constant. The square wave generator may comprise a controlled oscillator for generating an oscillation signal with a frequency controlled by a first control current and a digital-to-analogue converter for generating the square wave based on the oscillation signal. The digital-to-analogue converter may be biased with a second control current that varies with said first control current.

In some example a first reference waveform may define a PWM cycle period of the first PWM modulator and the controller may be configured to use the first reference waveform to define a PWM cycle period of the second PWM modulator.

In some examples the ADC may further comprise a time decoding converter for converting the second PWM signal to a digital feedback signal.

The modulator circuitry may further comprise a class D output stage controlled by the first PWM modulator. The class D output stage may be within the forward signal path. The first PWM signal received by the ADC may be derived from PWM output signal which is output from the class D output stage.

In some example an amplitude controller may control an amplitude of at least one of the first PWM signal and the second PWM signal combined at the input to the ADC.

The modulator circuitry may be implemented as an integrated circuit. In some implementations the modulator circuitry may further comprise an audio output transducer configured to be driven by the output PWM signal.

An aspects also relates to an electronic device comprising the modulator circuitry of any of the embodiments discussed herein.

In a further aspect there is provided modulator circuitry comprising: a first PWM modulator in a forward signal path for outputting a PWM output signal; a second PWM modulator in a feedback path configured to receive a first PWM signal derived from the PWM output signal and generate a second PWM signal; a controller for controlling the second PWM modulator such that a PWM carrier of the second PWM signal is phase and frequency matched to a PWM carrier of the first PWM signal.

In a further aspect there is provided a modulator circuit comprising: a first PWM modulator in a forward signal path; and a second PWM modulator in a feedback path; a controller for controlling the second PWM modulator such that a PWM carrier of the second PWM modulator is phase and frequency matched to a PWM carrier of the first PWM modulator.

Unless expressly indicated to the contrary, any of the various features of the various implementations discussed herein may be implemented together with any one or more of the other described features in any and all suitable combinations.

BRIEF DESCRIPTION OF THE DRAWINGS

For a better understanding of examples of the present disclosure, and to show more clearly how the examples may be carried into effect, reference will now be made, by way of example only, to the following drawings in which.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

As discussed above, FIG. 1 illustrates a class D amplifier circuit with a digital PWM modulator 101 operable in a closed-loop mode of operation. The use of digital PWM modulator 101 is advantageous, as such a PWM modulator can be readily implemented with smaller semiconductor process node geometries. For at least some applications there is generally a desire for small circuit area, for cost and/or space reasons.

As also noted above, to reduce distortion, the digital PWM modulator 101 may be operable as part of a feedback loop, with an ADC 103 in a feedback path. An anti-alias filter 104 is used to filter the input to the feedback ADC to remove tones in the feedback signal.

Typically the filter 104 may be implemented as an RC filter with a cut-off just outside the signal band of interest, e.g. the audio band for audio applications. This generally requires a relatively large capacitance, with a consequent impact on circuit area.

Embodiments of the present disclosure implement the feedback ADC as a PWM based ADC which operates so that a PWM carrier component of the PWM based ADC is matched to that of the PWM signal generated by the PWM modulator in the forward signal path.

Figure 1:
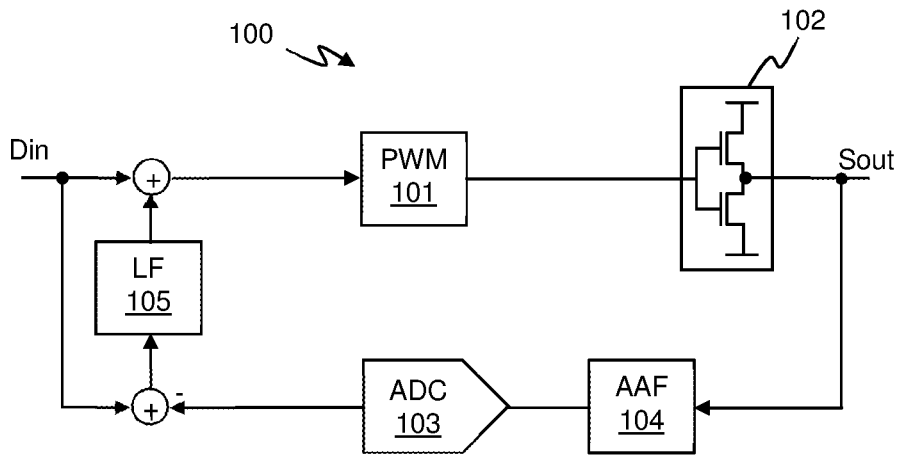
FIG. 1 illustrates a class D amplifier circuit having a digital PWM modulator.
Figure 2:
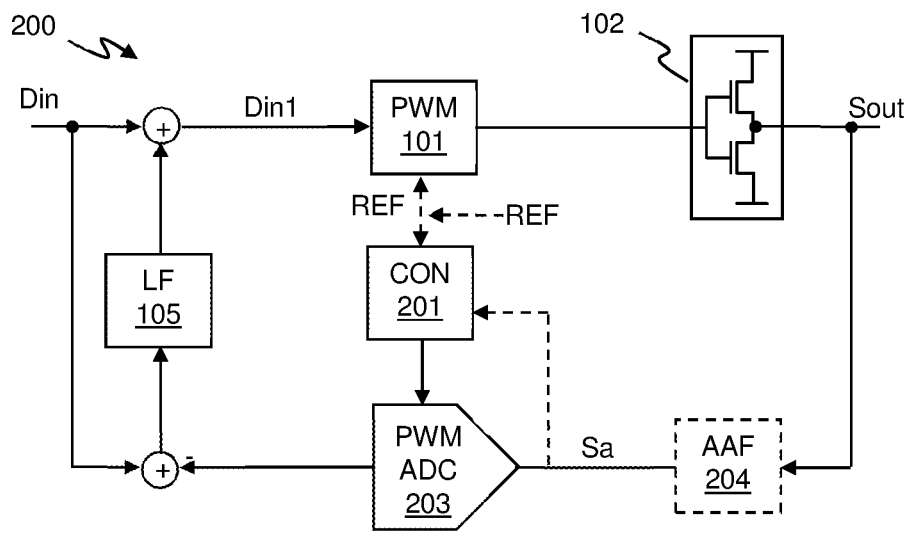
FIG. 2 illustrates a class D amplifier circuit according to an embodiment.

FIG. 2 illustrates one example of a circuit 200 including a time-encoding modulator according to an embodiment, in this case a class D amplifier circuit where similar components to those illustrated in FIG. 1 are identified with the same reference numerals.

FIG. 2 illustrates that a PWM modulator 101 is arranged in a forward signal path to generate a PWM signal based on a digital input signal Din to drive an output stage 102 to provide a PWM output signal Sout in the same way as discussed with respect to FIG. 1. The class D circuit is operable in a closed-loop mode of operation with feedback, and thus has a feedback path with an ADC 203 to provide a feedback signal. In the example of FIG. 2 the feedback signal is combined with the input signal to provide an error signal which is filtered by loop filter 105, which may, for example, be a first order integrator, but it will be understood that other arrangements may be implemented.

In the embodiment of FIG. 2, the ADC 203 in the feedback path is a PWM ADC 203. A PWM ADC is, as would be understood by one skilled in the art, an ADC which operates to generate a PWM signal based on its input signal, and thus includes a PWM modulator. Various types of PWM ADC are known and may be used for the PWM ADC 203, as will be discussed in more detail below. The PWM modulator 101 in the forward signal path is thus a first PWM modulator and the PWM ADC 203 comprises a second PWM modulator. The circuit 200 also comprises a controller configured to control the PWM ADC 203 so that the PWM carrier of the ADC 203 is phase and frequency matched to that of the PWM signal generated by the PWM modulator 101 in the forward signal path.

As will be understood by one skilled in the art, a PWM modulator, such as PWM modulator 101, operates to generate the PWM signal where the duty cycle of the PWM signal encodes the value of the input to the PWM modulator. That is, the PWM signal transitions between first and second signal levels and, in each PWM cycle, the proportion of time spent at the first signal level, compared to the second signal level, i.e. a pulse width, is controlled based on the input to the PWM modulator. The PWM cycle period, and the corresponding cycle frequency are referred to as the PWM carrier period (or just carrier period) and PWM carrier frequency (or just carrier frequency) respectively, as effectively a carrier signal at PWM carrier frequency is modulated to encode the input data by varying the pulse width. The term PWM carrier or just carrier thus refers to this underlying signal structure of the PWM signal and, in some respects, the PWM carrier may be seen as the PWM signal that would be generated for a quiescent input signal.

For some PWM modulators, the PWM carrier frequency may be defined by, or with respect to, a reference waveform, which may be received by or generated by the PWM modulator. For example, some PWM modulators compare the modulator input signal with a time varying reference waveform, such as a triangle or sawtooth waveform, to generate the PWM signal. In which case the frequency of the reference waveform defines the PWM carrier.

Figure 3A:
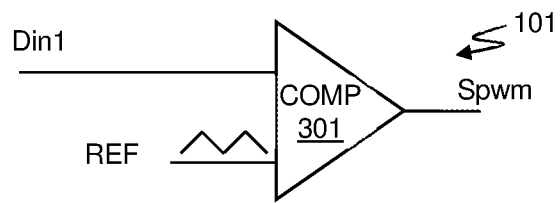
FIGS. 3a and 3b illustrate one example of generation of PWM signal.

FIG. 3a illustrates generally a PWM modulator such as may be implemented by PWM modulator 101 according to one example in which the input, Dint, is compared, by comparator 301 to a reference waveform REF to generate the PWM signal Spwm output from the modulator 101. In the example of FIG. 3, the reference waveform REF is a triangle waveform which ramps steadily from a first value to a second value, defined with respect to the input range of the input signal, before ramping back to the first value at the same magnitude of ramp rate. In the example of FIG. 3, the reference waveform REF starts low and the signal level of the PWM signal Spwm is low until the value of reference waveform REF increase above that of the input signal, at which point the PWM signal Spwm goes high and remains low until the reference waveform drops back below the value of the input signal. For this example the period P, over which the reference waveform REF ramps up and then ramps back down, defines the PWM carrier period and hence the carrier frequency. It will be appreciated that there is a PWM pulse every cycle period, and the PWM signal includes a signal component that arises from the PWM carrier frequency. It will of course be appreciated that other arrangements for generating a PWM signal may be used, but in general the PWM signal will contain some components due to PWM carrier.

Referring back to FIG. 2, as the PWM modulator 101 drives the output stage 102, the output signal Sout will also contain a signal component at the PWM carrier frequency of the PWM modulator 101. This PWM carrier frequency component is one of the main source of tones in the feedback signal that, for the conventional circuit 100 illustrated in FIG. 1, could result in undesirable issues on input to the ADC 103, and thus need to be filtered by the AAF 104.

In the circuit of FIG. 2, however, the ADC in the feedback path is a PWM ADC 203 and the circuit is controlled by controller 201 so that the PWM carrier component of the PWM ADC 203 is phase and frequency matched to the PWM carrier of the signal generated by the PWM modulator 101. If the carrier of the PWM based ADC 203 is phase and frequency matched to that of the PWM signal generated by the PWM modulator 101, the PWM tones at the input to the ADC 203 can be at least partly cancelled or suppressed by the operation of the ADC 203. In particular PWM tones generated by operation of the PWM ADC 203 are phase matched to the PWM tones generated by the PWM modulator 101, which means that these tones can, at least partly, cancel at the input to the ADC 203.

Suppression of the PWM tones in this way means that the requirement for filtering of the signal that is supplied as the input signal Sa to the ADC in the feedback path is significantly reduced. In some implementations an anti-alias filter may be omitted, i.e. there may be no filter in the feedback path upstream of the ADC 203. In some implementations though it may still be beneficial to apply some filtering to the feedback signal upstream of the ADC 203, but the requirements for such filtering may be more relaxed than the conventional approach, given that PWM tones in the feedback signal are less of a concern. Thus in some implementations there may be a filter 204 in the feedback path, upstream of the ADC 203, but the filter 204 may be implemented as a significantly smaller filter, in terms of circuit area, than the conventional filter 104, for instance with a smaller capacitor area.

The use of a PWM ADC 203, with a PWM carrier that is phase matched to that of the PWM signal generated by the PWM modulator 101 in the forward signal path, thus significantly reduces the need for filtering of the feedback signal, in closed-loop operation. This means that a filter in the feedback path, upstream of the ADC, can be significantly smaller than otherwise would be the case, or even omitted completely, with a consequent saving on circuit area, and hence size and cost of the circuit.

In addition, applying less filtering to the feedback signal can reduce the delay of the feedback path, and hence the overall delay of feedback loop, which can be advantageous in allowing a greater gain within the feedback loop. As will be understood by one skilled in the art, the responsiveness of the feedback loop to any changes depends on the loop delay, and gain within the feedback loop is usually set with regard to the loop delay. If the loop delay is relatively long, the gain may be limited so as to avoid the amount of overshoot. That is, if there is some error between the input and the output, the operation of the loop will apply some error correction until the correct value is reached, at which point the error correction is no longer needed, but the loop delay will limit the speed of response, which can lead to some overshoot, and the amount of overshoot depends on the gain. A reduced delay can allow the use of a greater gain, which can be advantageous for performance of the class D amplifier in at least some applications.

Using a PWM ADC 203 in a feedback path, for closed loop operation of a digital PWM modulator in a forward signal path, with a PWM carrier of the PWM ADC matched to that of the PWM signal in the forward signal path, can thus provide advantages in terms of size, cost and/or performance.

The PWM carrier of the PWM ADC 203 may be controlled to be matched to that of the PWM signal generated in the forward signal path in various ways.

Figure 3B:
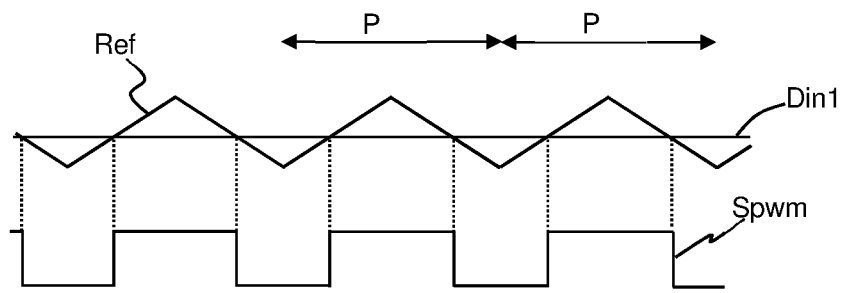

In one implementation, the PWM modulator 101 may generate its PWM output signal using a time varying reference waveform, REF, for example a triangle or sawtooth waveform such as discussed with respect to FIG. 3b, and the same reference waveform may also be used for the PWM ADC 203.

FIG. 2 thus illustrates that the controller 201 may use the same reference waveform REF to control the PWM ADC 203 as is used by the PWM modulator 101 in the forward signal path. In some implementations the controller 201 may generate the reference waveform REF and provide a version to the PWM modulator 101. Alternatively the controller 201 may receive a version of the reference waveform REF generated by the PWM modulator 101, or from some other source, and use it to control the PWM ADC 203. In such an implementation the controller 201 may comprise components of the PWM ADC 203 for generating a PWM signal, e.g. a comparator for comparing the reference waveform REF with a signal derived from the input to the ADC 203.

The use of the same reference waveform for the PWM modulator 101 in the forward signal path and the PWM ADC 203 will ideally provide a degree of synchronisation of the PWM carriers. Ideally the carriers would be exactly matched, however, in practice, analogue effects and the impact of the load, may result in some timing differences in the output PWM signal Sout, which is supplied to the ADC 203 as the ADC input Sa, and the PWM signal generated within the PWM ADC 203. If the load driven by the output signal is relatively strongly reactive there will be phase variances arising due to the load.

To provide the greatest suppression of the PWM tones, the PWM tones generated by operation of the PWM ADC 203 should be matched in phase and amplitude to the PWM tones in the input to the PWM ADC 203. However, effective suppression is more sensitive to errors in phase, and thus phase variations in the PWM output signal Sout, and hence the ADC input Sa, compared to the operation of the PWM ADC 203, may adversely impact the effective suppression of the tones.

In some applications, the use of the same reference waveform for the PWM modulator 101 in the forward signal path and the PWM ADC 203 may provide a sufficient degree of phase matching of the PWM carriers, that the PWM tones at the input to the ADC 203 are suppressed to a sufficient extent for that application. In some applications, however, it may be desirable to ensure a greater degree of phase matching of the carriers than may be expected just through the use of the same reference waveform.

In some implementations, therefore, the controller 201 may, as illustrated in FIG. 2, be configured to monitor the signal Sa input to the PWM ADC 203 and control the carrier of the PWM ADC 203 based on the monitoring. The controller 201 may thus selectively vary the timing of the carrier of the PWM ADC 203 based on the monitored signal Sa, so as to match the phase and frequency of the carrier of the PWM ADC 203 to this ADC input signal Sa.

In particular, in some implementations, the controller 201 may comprise a phase detector for detecting the extent of any difference in phase between the PWM carrier of the signal Sa input to the PWM ADC 203 and the PWM carrier of the PWM ADC 203. The controller may be configured to control one or more timing parameters of the PWM ADC 203 so as to minimise the overall phase difference and hence provide frequency and phase matching of the PWM carriers. In essence the controller 201 may be implemented as part of a phase-locked loop apparatus for locking the PWM carrier of the PWM ADC 203 to that of the ADC input signal Sa.

Figure 4:
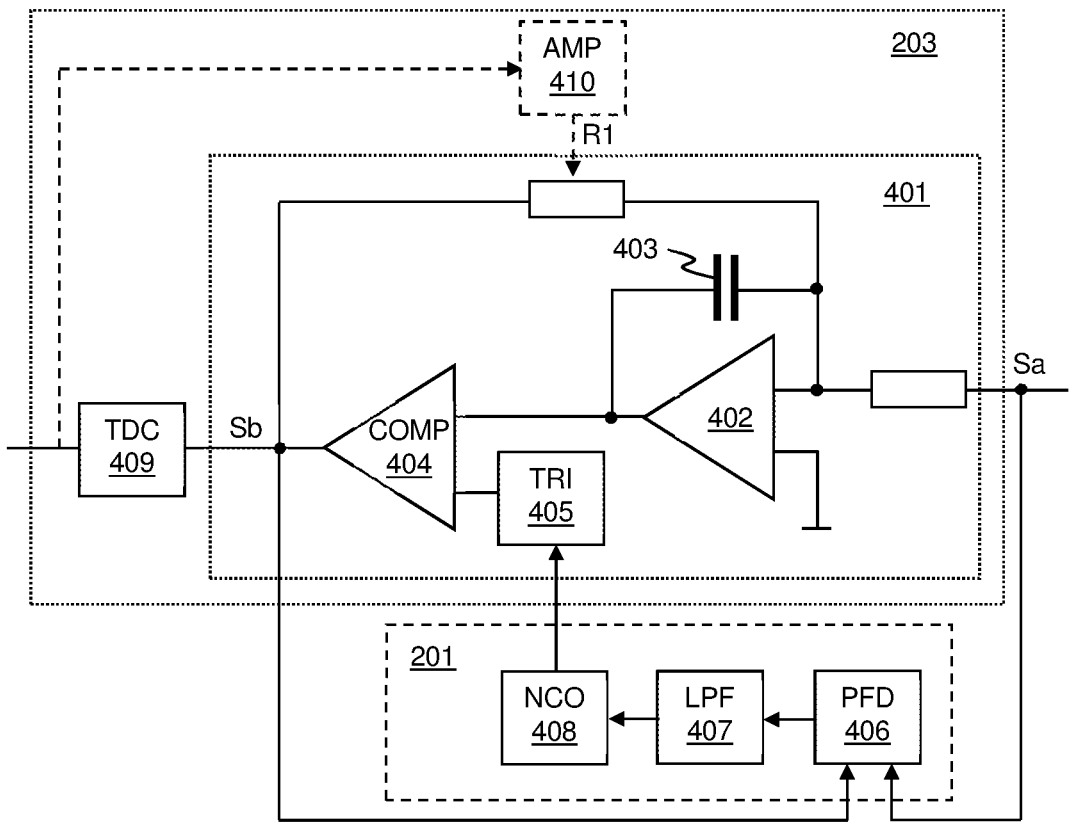
FIG. 4 illustrates an example of PWM ADC and controller for controlling the timing of the PWM carrier.

FIG. 4 illustrates one example of a controller 201 for controlling generation of a PWM signal within PWM ADC 203. The PWM ADC 203 comprises a PWM modulator 401 that receives the ADC input signal Sa (a first PWM signal) and which produces a PWM signal Sb (a second PWM signal). The ADC input signal Sa, i.e. the first PWM signal, is combined with feedback from the output of the PWM modulator 401, i.e. with a version of the second PWM signal Sb, and applied to the input of an integrator formed by op-amp 402 and capacitor 403. The output of the integrator is supplied to comparator 404, which in this example compares the integrator output with a triangle waveform provided by triangle waveform generator 405 to generate the ADC PWM signal Sb. Equivalently however the output of the integrator could be combined with the triangle waveform and compared to a defined threshold. As will be understood by one skilled in the art, the PWM carrier of the PWM signal Sb is defined by the triangle waveform generated by the triangle waveform generator 405.

In the example of FIG. 4, the controller 201 controls the triangle waveform generator 405 so as to control the timing parameters of the triangle waveform and hence control the PWM carrier of the signal Sb to match that of the input Sa. The controller 201 operates effectively as a phase locked loop (PLL), as would be understood by one skilled in the art, with input Sa being the reference signal for the PLL. The signal Sa input to the ADC is supplied to a phase and frequency detector (PFD) 406, which also receives the signal Sb generated by the ADC PWM modulator 401. The PFD 406 determines the amount of any phase lag or lead between defined signal transitions, e.g. high-to-low and/or low-to-high in the signal Sb and the corresponding signal transitions in the signal Sa. The measured time difference between the signal transitions, i.e. phase lag or phase lead, are filtered by low pass filter (LPF) 407 to provide an indication of any phase difference, i.e. phase error. For a PWM signal such as discussed with respect to FIG. 3, where each PWM pulse is temporally symmetric about the midpoint of the relevant cycle period, the phase difference of both signal transitions (i.e. high-to-low and low-to-high) is determined, so the LPF 407 indicates the average phase difference over each cycle and thus represents the extent of any phase mismatch between the PWM carriers of the signals Sa and Sb. The output of the filter 407 is used to adjust operation of a numerically controlled oscillator (NCO) 408, which generates an oscillation signal which is used by the triangle waveform generator 405.

If the output of LPF 407 indicates a phase error in the PWM carrier of signal Sb compared to ADC input Sa, the NCO 408 frequency is adjusted, e.g. increased if the PWM carrier of the signal Sb has a phase lag compared to that of the signal Sa, so as to bring forward the start of the PWM cycles, and decreased if instead the signal Sb has a phase lead so as to delay the PWM cycles. The controller 201 thus locks the PWM carrier of the signal Sb generated by the ADC PWM modulator 401 to match that of the input Sa to the ADC 203.

The triangle wave generator 405 operates to generate the triangle waveform with a period defined by the oscillation signal generated by the NCO 408. For instance if the NCO 408 generates a signal with high and low pulses of equal duration, at the controlled frequency, the state of the NCO output could control a ramp generator to ramp up or ramp down respectively.

It will be understood that varying the period of the triangle wave should ideally not result in any significant variation in the excursion of the triangle waveform. For example, as discussed above with reference to the example of FIG. 3b, the triangle wave may ramp from a first value to a second value and then back to the first value over the course of the PWM cycle period and the first and second values may be set with respect to the expected range of the input signal. Ideally the first and second values should not vary significantly with any variation to the cycle period, as any change to the first and second values, i.e. the excursion of the triangle wave, will result in a change of the conversion gain for the PWM modulator 401 of the ADC 203. The triangle wave generator 405 may therefore be configured so that there is no significant variation in excursion of the triangle waveforms when the period is varied and may in particular be configured to vary the rate of ramping of the triangle waveform in accordance with any change in the cycle period. One skilled in the art will understand that there are various ways in which such a triangle wave generator may be implemented. For instance the triangle wave generator 405 could comprise one more current sources for driving defined charging and discharging currents into an integrator for periods defined by the oscillation signal from the NCO 408. The current source(s) may be controlled based on an indication of the cycle period/frequency so as to vary the strength of the charging and discharging currents.

The controller 201 thus controls the operation of the PWM ADC 203 so that the PWM carrier of the PWM signal Sb generated by the PWM ADC 203 is phase and frequency matched to that of the signal Sa which is input to the ADC 203. This means that at the input to the PWM ADC 203, the signal Sa input to the ADC 203 is combined with ADC feedback, from the ADC output signal Sb, which has a phase and frequency matched carrier and the PWM tones in the input are at least partly suppressed as discussed above.

The PWM signal Sb generated by the PWM ADC 203 may, in some examples, be converted to a suitable digital by a time-decoding converter (TDC) 409. The TDC may, for instance, comprise a voltage controlled oscillator for generating an oscillator signal that varies between two frequencies, Fhi and Flo based on the signal level of the PWM signal Sb, and a counter for counting the number of oscillations in a count period, which is indicative of the duty cycle of the PWM signal Sb and hence the value of the signal Sa input to the ADC 203.

Any mismatch in amplitude between the signal Sa input to the ADC 203 and the feedback from the PWM signal Sb generated by the ADC 203 may detrimentally affect the amount of suppression, although mismatch in phase has a larger effect. The amplitude of signal Sa input to the ADC depends on any level shifting applied to the signal tapped from the forward signal path and the value of an input resistance of the ADC. The amplitude of the feedback from the ADC PWM signal Sb depends on the amplitude of the PWM signal as generated by the PWM modulator 401 and the value of the feedback resistance. In some examples the PWM modulator 401 may be designed, together with any level shifting or scaling applied to the feedback signal tapped from the forward signal path so that the relevant amplitudes are sufficiently matched. In some examples, however, there may be amplitude controller 410 configured to control the amplitude of at least one of the signals. FIG. 4 illustrates that the amplitude controller may control the value R1 of the feedback resistance of the PWM modulator 401 to control the amplitude of the feedback from signal Sb. The amplitude controller 410 may monitor the digital signal generated by the ADC 203 to monitor for any amplitude error, for example by bandpass filtering at an appropriate frequency range.

Figure 5:
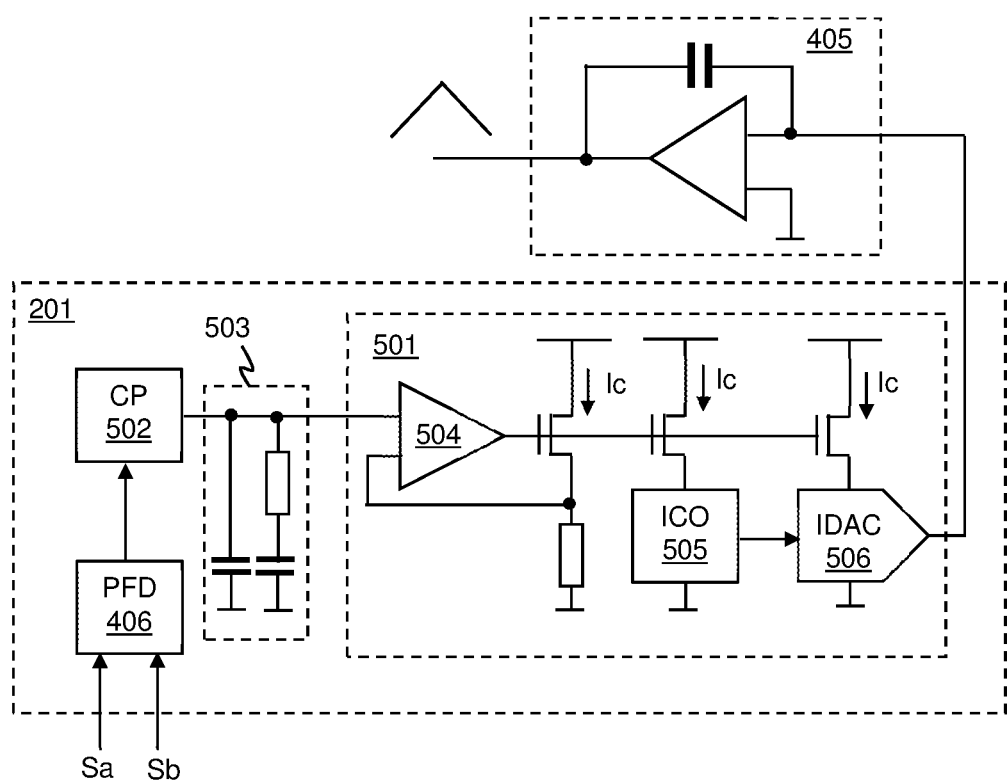
FIG. 5 illustrates another example of a controller for controlling the timing of a PWM carrier.

FIG. 5 illustrates another example of a suitable controller 201 for controlling timing of the PWM carrier for PWM ADC 203, in which similar components to those discussed with respect to FIG. 4 are identified by the same reference numerals. FIG. 5 omits some of the details of the ADC 203 for clarity, which may be implemented in a similar way to that illustrated in FIG. 4.

The controller 201 of the example of FIG. 5 includes a square wave generator 501 operable to generate a square waveform, with a period which is controllably variable. The square wave generator 501 is configured so that the amplitude of the square wave varies with the period so that the product of the amplitude and the period remains substantially constant. Integrating such a square wave will result in a triangle waveform, with a period that varies with that of the square wave but which has a substantially constant overall excursion. The controller 201 may thus control the period, and hence frequency, of the square waveform to control the PWM carrier in a similar manner as discussed above.

FIG. 5 thus illustrates that the controller 201 comprises a PFD 406 that receives an indication of the timing of the signal Sa input to the ADC 203 and the signal Sb generated by the PWM modulator 401 of the ADC. The PFD 406 determines the extent of any phase difference between these signals in a similar way as discussed with reference to FIG. 4. In the example of FIG. 5 the PFD controls a voltage source, in this example a charge pump 502, to generate a control voltage which is supplied to the square wave generator 501 via a passive filter 503. The control voltage is converted to a control current Ic, in this example by amplifier 504 regulating the current through a resistance to generate a voltage equal to the control voltage. The control current Ic is also supplied to a current controlled oscillator (ICO) 505 to generate an oscillation signal with a frequency controlled by the control current, and hence the control voltage. The output from the ICO 505 is supplied to an IDAC 506, optionally via a frequency divider (not illustrated), so that the IDAC 506 generates the output square wave. The IDAC is biased with the control current Ic so that the amplitude of the output of the IDAC 506 scales with the control current. It will, of course, be understood that the current used to control the ICO 505 and/or the current to bias the IDAC 506 may be scaled version of the control current Ic.

As discussed with reference to FIG. 4, in the PWM ADC 203, the triangle waveform may be supplied to one input of comparator 404 to be compared with the output of integrator 402/403. In other implementations the triangle waveform may be combined with the output of the integrator 402/403. In a further implementation the square wave generated by the square waveform generator 501 could instead be supplied to the input of the integrator op-amp 402. In other words the square wave may be combined with the ADC input Sa and feedback from Sb. In this case the integrator of the PWM modulator 401, i.e. formed by op-amp 402 and capacitor 403, also acts as the triangle wave generator 405 and converts the square wave signal component to a triangle wave component in the signal provided to the comparator 404.

In any event the controller 201 adjusts the timing of the square wave so as to minimise the overall phase difference between the PWM output Sb and the input Sa to the ADC 203 and hence to lock the PWM carrier of the PWM ADC 203 to that of the input Sa.

Embodiments of the present disclosure thus relate to modulator circuitry with a forward signal path including, a PWM modulator, for outputting an output PWM signal, where the modulator circuitry is operable in a closed loop mode of operation, with an ADC operating in a feedback path. In embodiments of the disclosure the ADC in the feedback path is a PWM ADC which is controlled so as to operate with a PWM carrier which is phase matched to the PWM carrier of the output PWM signal, and hence to the PWM carrier in the signal input to the ADC. In at least some examples the PWM ADC receives a first PWM signal, which is tapped from the forward signal path and generates a second PWM signal, and the first PWM signal is monitored so as to adaptively control the second PWM signal. The first PWM signal may be combined with the second PWM signal at an input to the ADC to suppress PWM tones at the input to the ADC.

The examples have been discussed above with reference to a class D type amplifier or driver circuit but the principles are applicable to closed loop PWM modulators that may be used for other applications. Thus referring to FIG. 2, the output stage 102 may not be present in some application or may have a different form. It will also be understood that embodiments could be implemented in a differential arrangement and thus the signals discussed could be differential signals, e.g. PWM modulator 101 could be a differential PWM modulator.

In some implementations, the modulator circuitry may additionally be operable in an open-loop mode of operation, where the PWM modulator 101 in the forward signal path is operable without any feedback. In the open-loop mode of operation the components of the feedback path may be disabled, which may allow for power saving. The open-loop mode of operation may thus be enabled in some circumstances where reduced power consumption is desired and/or the performance benefits provided by the feedback path being active are not required. In some applications the circuit may dynamically transition between open and closed-loop modes of operation as required, e.g. based on an indication of signal level or a required performance or power consumption. Additionally or alternatively, in some implementations the circuitry may be operated in open-loop mode as part of a start-up or reset procedure, with the circuit then transitioning to a closed-loop mode of operation.

Embodiments may be advantageously implemented as part of audio processing circuitry, e.g. for audio amplifiers for providing audio driving signals to audio output transducers such as loudspeakers, which may be transducers of a host device and/or transducers of an accessory apparatus which may be removably connected to the host device in use.

Embodiments may be arranged as part of an audio and/or signal processing circuit, for instance an audio circuit such as a codec which may be provided in a host device. A circuit according to an embodiment of the present invention may be implemented as an integrated circuit.

Embodiments may be incorporated in a host electronic device, which may for example be a portable device and/or a device operable with battery power. The host device could be a device with one or more loudspeaker provided as part of the host device and/or a connector for making a wired connection with a loudspeaker of a removable accessory apparatus that may be removably connected to the host device in use. The host device may include a wireless communication module for receiving input data. The host device could be a communication device such as a mobile telephone or smartphone or similar, a computing device such as notebook, laptop or tablet computing device, a wearable device such as a smartwatch. The host device could alternatively be an accessory device for use with any such communication, computing or wearable device.

The skilled person will recognise that some aspects of the above-described apparatus and methods, may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus, the code may comprise conventional program code or microcode or, for example code for setting up or controlling an ASIC or FPGA. The code may also comprise code for dynamically configuring re-configurable apparatus such as re-programmable logic gate arrays. Similarly, the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Modulator circuitry comprising:
 a forward signal path for receiving a digital input signal and outputting an output PWM signal, the forward signal path comprising a first PWM modulator;
 a feedback path for providing feedback to an input of the first PWM modulator, the feedback path comprising an ADC configured to receive a first PWM signal derived from the output PWM signal;
 wherein the ADC comprises a second PWM modulator configured to generate a second PWM signal based on the first PWM signal; and
 a controller for controlling the second PWM modulator such that a PWM carrier of the second PWM signal is phase and frequency matched to a PWM carrier of the output PWM signal.

2. The modulator circuitry of claim 1 wherein the ADC is configured to combine, at an input to the ADC, the first PWM signal with the second PWM signal generated by the second PWM modulator.

3. The modulator circuitry of claim 1 wherein the controller is configured to monitor the first PWM signal and to adaptively control the ADC based on the monitored first PWM signal to match the PWM carrier of the second PWM signal to that of the first PWM signal.

4. The modulator circuitry of claim 1 wherein the controller is configured to monitor the first PWM signal and the second PWM signal to determine any phase differences between defined signal transitions in the first and second PWM signals and to control the ADC to reduce said phase differences.

5. The modulator circuitry of claim 4 wherein the controller forms a phase-locked-loop with at least part of the second PWM modulator.

6. The modulator circuitry of claim 4 wherein the controller comprises a phase and frequency detector for determining said phase differences.

7. The modulator circuitry of claim 3 wherein the controller is configured to adaptively control a frequency of a reference waveform, wherein the reference waveform defines a PWM cycle period of the second PWM modulator.

8. The modulator circuitry of claim 7 wherein the reference waveform is a triangle waveform and the controller comprise a controlled oscillator for generating an oscillation signal at a controlled frequency, wherein the second PWM modulator comprises a triangle waveform generator configured to generate a triangle waveform that ramps up and down based on the oscillation signal.

9. The modulator circuitry of claim 7 wherein the reference waveform is a triangle waveform and the controller comprise a square wave generator for generating a square wave which is supplied to an integrator to generate the triangle waveform, wherein the square wave generator is configured such that square wave has a controllably variable cycle period and with an amplitude that varies with any change in cycle period so that a product of amplitude and period is substantially constant.

10. The modulator circuitry of claim 9 wherein the square wave generator comprises a controlled oscillator for generating an oscillation signal with a frequency controlled by a first control current and a digital-to-analogue converter for generating the square wave based on the oscillation signal, wherein the digital-to-analogue converter is biased with a second control current that varies with said first control current.

11. The modulator circuitry of claim 1 wherein a first reference waveform defines a PWM cycle period of the first PWM modulator and the controller is configured to use the first reference waveform to define a PWM cycle period of the second PWM modulator.

12. The modulator circuitry of claim 1 wherein the ADC further comprises a time decoding converter for converting the second PWM signal to a digital feedback signal.

13. The modulator circuitry of claim 1 further comprising a class D output stage controlled by the first PWM modulator.

14. The modulator circuitry of claim 13 wherein the class D output stage is within the forward signal path and the first PWM signal received by the ADC is derived from PWM output signal which is output from the class D output stage.

15. The modulator circuitry of claim 1, when dependent directly or indirectly on claim 2, further comprising an amplitude controller for controlling an amplitude of at least one of the first PWM signal and the second PWM signal combined at the input to the ADC.

16. The modulator circuitry of claim 1 implemented as an integrated circuit.

17. The modulator circuitry of claim 1 further comprising an audio output transducer configured to be driven by the output PWM signal.

18. An electronic device comprising the modulator circuitry of claim 1.

19. Modulator circuitry comprising:
 a first PWM modulator in a forward signal path for outputting a PWM output signal;
 a second PWM modulator in a feedback path configured to receive a first PWM signal derived from the PWM output signal and generate a second PWM signal;
 a controller for controlling the second PWM modulator such that a PWM carrier of the second PWM signal is phase and frequency matched to a PWM carrier of the first PWM signal.

20. A modulator circuit comprising:
 a first PWM modulator in a forward signal path; and
 a second PWM modulator in a feedback path;
 a controller for controlling the second PWM modulator such that a PWM carrier of the second PWM modulator is phase and frequency matched to a PWM carrier of the first PWM modulator.

* * * * *